United States Patent [19]
Choi

[11] Patent Number: 5,926,421
[45] Date of Patent: *Jul. 20, 1999

[54] SEMICONDUCTOR MEMORY DEVICES WITH SPARE COLUMN DECODER

[75] Inventor: Yoon Taek Choi, Ichon-shi, Rep. of Korea

[73] Assignee: Hyundai Electronics Industries Co., Ltd., Ichon-shi, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/885,940

[22] Filed: Jun. 30, 1997

[30] Foreign Application Priority Data

Jun. 29, 1996 [KR] Rep. of Korea ............ 96-25740

[51] Int. Cl.$^6$ ............................ G11C 7/00
[52] U.S. Cl. ............ 365/200; 365/230.06; 365/189.04; 365/189.07
[58] Field of Search ............ 365/200, 201, 365/230.06, 210, 104, 208, 189.07, 196, 185.09, 189.04

[56] References Cited

U.S. PATENT DOCUMENTS

| | | |
|---|---|---|
| 5,469,401 | 11/1995 | Gillingham . |
| 5,488,585 | 1/1996 | Kim ............................ 365/210 |
| 5,504,712 | 4/1996 | Conan . |
| 5,544,113 | 8/1996 | Kirihata et al. ............ 365/200 |
| 5,561,636 | 10/1996 | Kirihata et al. ............ 365/201 |
| 5,708,619 | 1/1998 | Gillingham ............ 365/230.06 |

FOREIGN PATENT DOCUMENTS

| | | |
|---|---|---|
| 2 154 032 | 8/1985 | United Kingdom . |
| 2 195 480 | 4/1988 | United Kingdom . |
| 2 239 534 | 7/1991 | United Kingdom . |
| 2 300 285 | 10/1996 | United Kingdom . |

*Primary Examiner*—David Nelms
*Assistant Examiner*—Thong Le
*Attorney, Agent, or Firm*—Thelen Reid & Priest LLP

[57] ABSTRACT

Disclosed is a semiconductor memory device having a plurality of memory cell arrays made of normal column cell arrays and spare column cell arrays, and a global column decoder for simultaneously selecting normal column lines of the memory cell array, wherein spare column decoders for selecting spare column lines of each spare column cell array are respectively and independently formed in the spare column cell arrays.

4 Claims, 6 Drawing Sheets

SEMICONDUCTOR MEMORY DEVICES WITH SPARE COLUMN DECODER

BACKGROUND OF THE INVENTION

1. Field of the Invention

The present invention relates to semiconductor memory devices with a column redundancy circuit and, more particularly, to a semiconductor memory device for enhancing the repair efficiency by allocating a plurality of spare column decoders to the spare column arrays by adopting a local repairing method.

2. Discussion of Related Art

FIG. 1 is a block diagram of a conventional semiconductor memory device.

As illustrated in FIG. 1, the conventional memory device includes a plurality of memory cell arrays each made of word lines and column lines; normal column cell arrays and spare column cell arrays respectively formed in the memory cell arrays; data input/output lines connected to a data bus line of each memory cell array and for inputting/outputting the normal column data and spare column data; a global normal column decoder simultaneously selecting the normal column lines of the memory cell array; a spare column decoder simultaneously selecting the spare column lines of the memory cell array; a global normal column line selecting signal output from the global normal column decoder and for simultaneously selecting the normal column lines from each memory cell array; and a global spare column line selecting signal output by the spare column decoder and for selecting the spare column lines from the spare column array.

In the conventional memory device, the global normal column line selecting signal of the global normal column decoder is commonly connected through the normal column lines of each memory cell array. The spare column line selecting signal output from each spare column decoder is commonly connected through each spare column line of the spare column array. Therefore, structuring the circuit is easy. But, its repairing efficiency is decreased. For example, when a certain error is generated in the memory cell array 0, the memory cell arrays 1 through n are all repaired. Therefore, if the total number of the errors generated in the entire memory cell array is more than that of the spare column lines of each memory cell array, its repair is impossible and its repairing efficiency is also decreased.

FIG. 2 is a controlling circuit diagram of a memory cell array of the semiconductor memory device of FIG. 1.

As illustrated in FIG. 2, if the global normal column line selecting signal is applied to the gates of the first and second NMOS type transistors MN1 and MN2 at the state where power voltage Vcc enables the data bus line through the transistor turned on by the data bus bias signal, data of each memory cell array connected to the corresponding normal column line are output to the data bus line. Here, only the corresponding data are output through the data input/output line of each memory cell array, amplified by the data sense amplifier and output to the output port.

Meanwhile, if a certain defect is generated in the corresponding normal column line, the global normal column decoder is disabled to cut off the selection of the normal column line, and the spare column decoder outputting the spare column line selecting signal is enabled to alternate with the spare column line.

Even though the global spare column line selecting signal is applied to the gates of the third and fourth NMOS type transistors MN3 and MN4 and all data connected to the corresponding spare column lines of each spare column array are output to the data bus line, only the data connected to the data input/output line of the corresponding spare cell array are output to the output port through the data bus sense amplifier.

FIG. 3 is an operational timing diagram of FIG. 2.

As illustrated in FIG. 3, when the global normal column line selecting signal is applied at the state where the data bus bias signal is enabled to be low, the datum are outputted to the data bus line and the inverted data bus line. When the normal column line selecting signal is disabled and the global spare column line selecting signal is enabled, the normal column data are disabled and the spare column data are enabled in the data bus line and the inverted data bus line.

As described above, as the conventional column redundancy circuit uses a method for simultaneously selecting the corresponding spare column line of each spare column array through the global column decoder, the repairing efficiency of the entire defect normal column line is decreased when the number of the defected normal column lines in the entire memory cell array are more than the number of the spare column lines of each memory cell array. Moreover, other spare column lines excluding the corresponding spare column line should be repaired.

SUMMARY OF THE INVENTION

The present invention is directed to a semiconductor memory device that substantially obviates one or more of the problems due to limitations and disadvantages of the related art.

An objective of the present invention is to provide a semiconductor memory device which easily facilitates a structure of a general column circuit by using a global column decoder and enhances the repairing efficiency by using a local repairing method.

Additional features and advantages of the invention will be set forth in the description which follows, and in part will be apparent from the description, or may be learned by practice of the invention. The objectives and other advantages of the invention will be realized and attained by the structure indicated in the written description and claims hereof, as well as the appended drawings.

To achieve these and other advantages and in accordance with the purpose of the present invention, as embodied and broadly described, a semiconductor memory device includes a plurality of memory cell arrays made of normal column cell arrays and spare column cell arrays, and a global column decoder for simultaneously selecting normal column lines of the memory cell array, wherein spare column decoders for selecting spare column lines of each spare column cell array are respectively and independently formed in the spare column cell arrays.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide further understanding of the invention and are incorporated in and constitute a part of this specification, illustrate embodiments of the invention and together with the description serve to explain the principles of the invention.

DETAILED DESCRIPTION OF PREFERRED EMBODIMENT

Reference will now be made in detail to the preferred embodiments of the present invention, examples of which are illustrated in the accompanying drawings.

Figure 1:
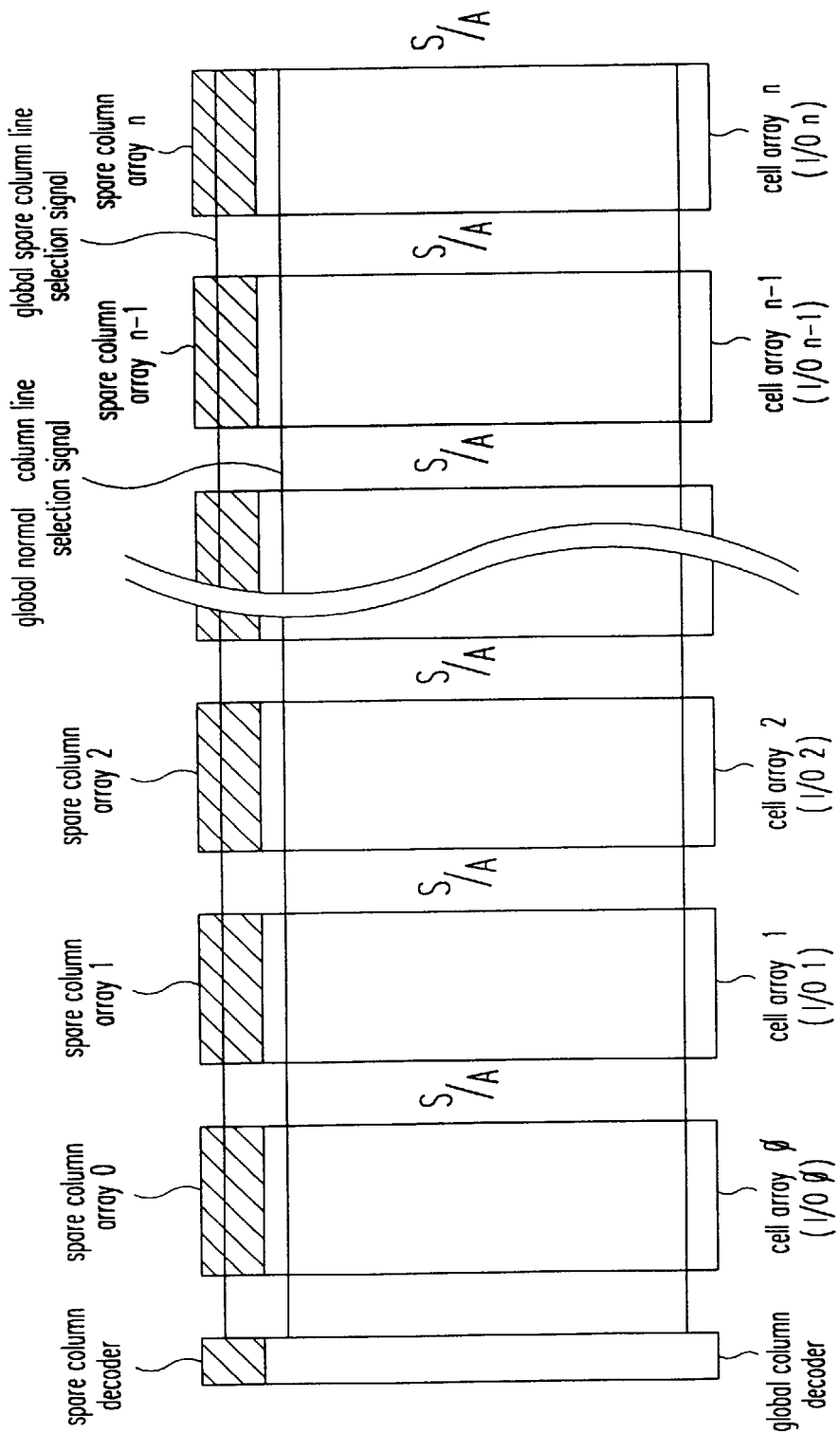
FIG. 1 is a block diagram of a conventional semiconductor memory device.
Figure 2:
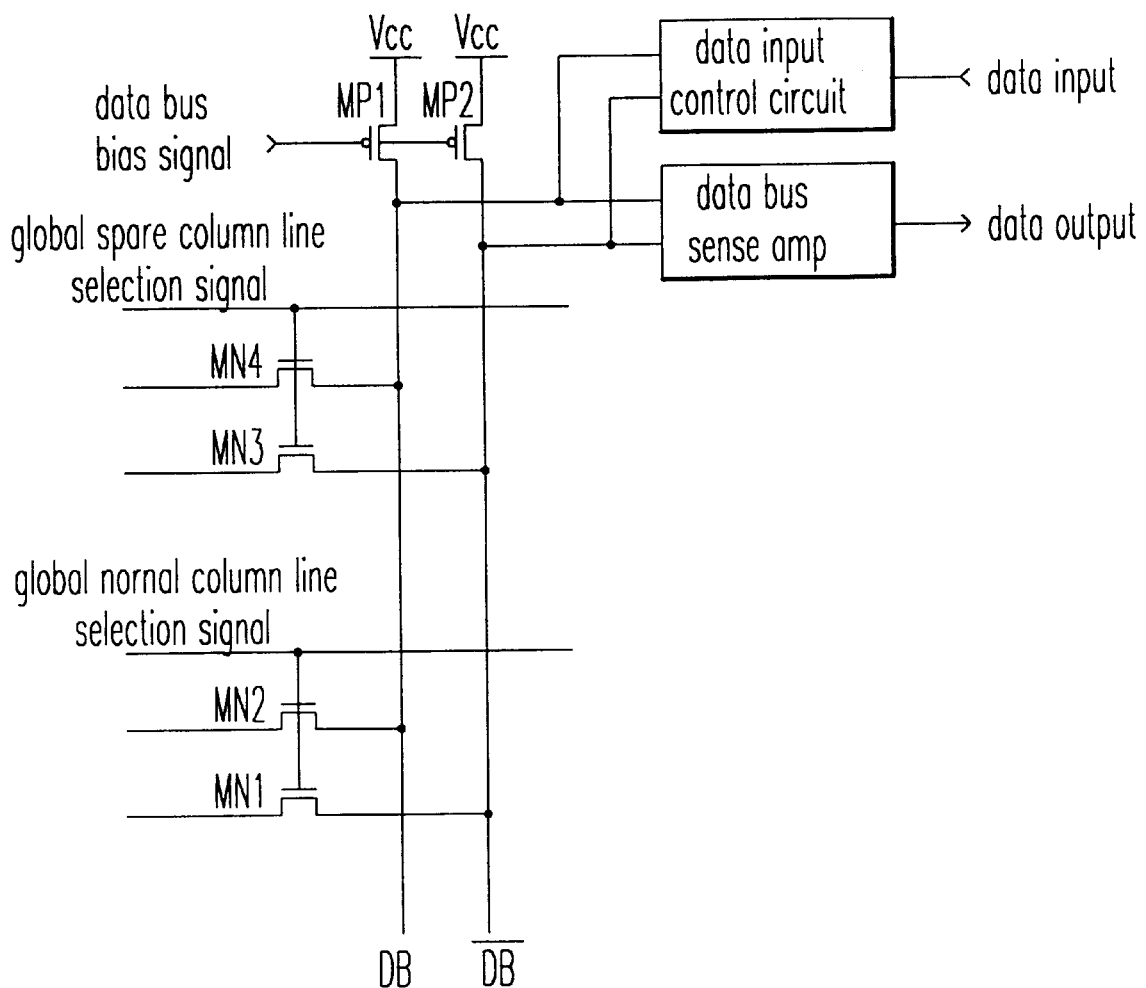
FIG. 2 is a controlling circuit diagram of the memory cell arrays of the semiconductor memory device of FIG. 1.
Figure 3:
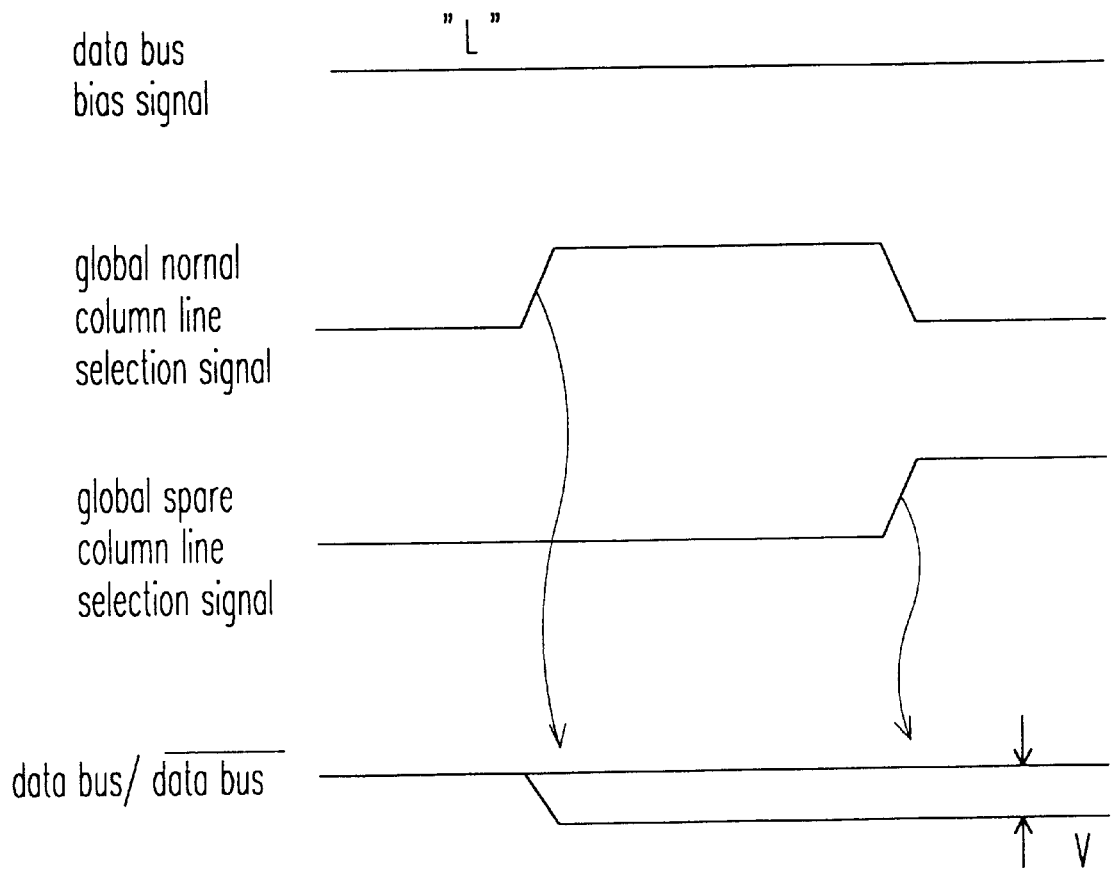
FIG. 3 is an operational timing diagram of the controlling circuit diagram of the semiconductor memory device of FIG. 2.
Figure 4:
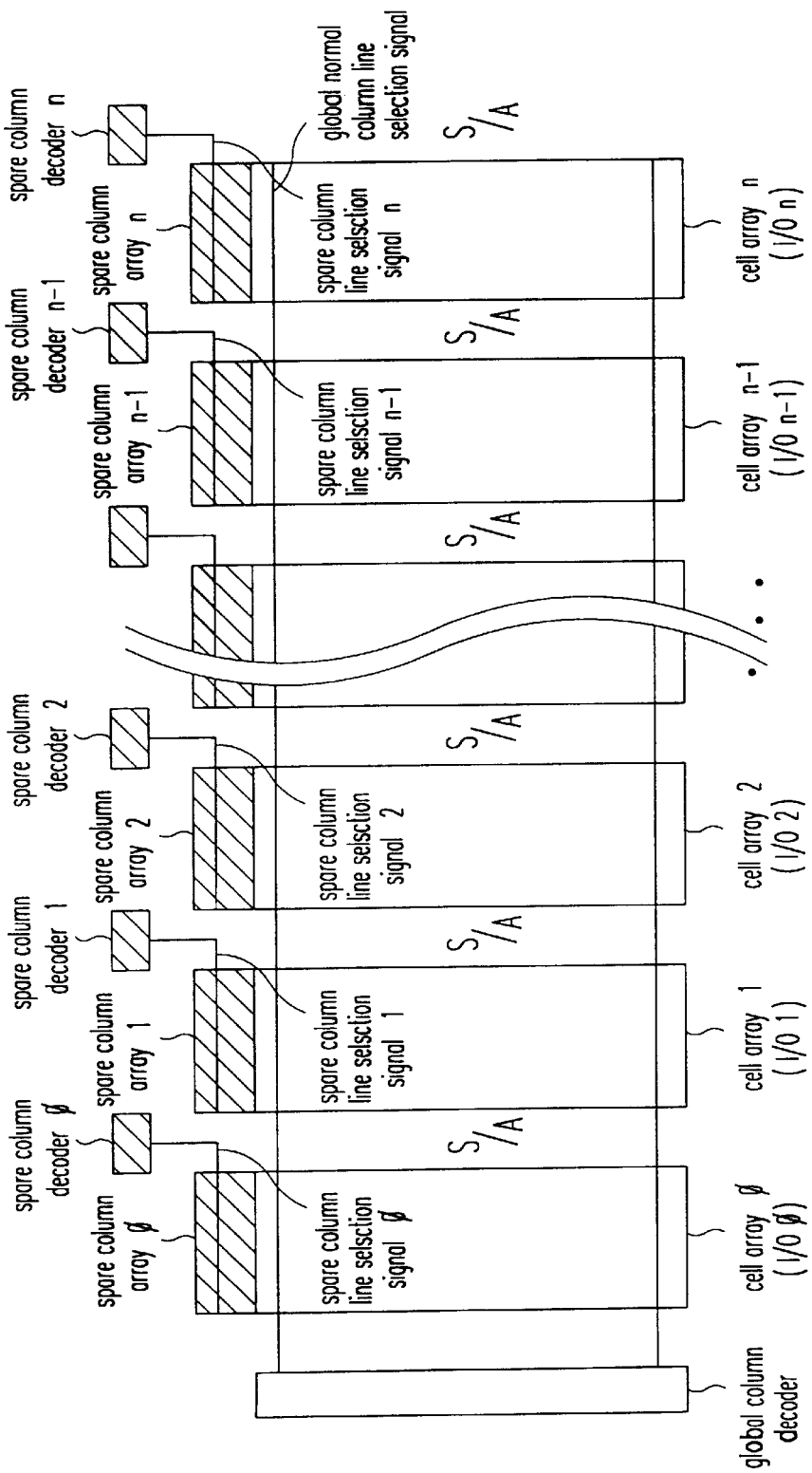
FIG. 4 is a block diagram of the semiconductor memory device of the invention.

As illustrated in FIG. 4, the semiconductor memory device of the invention includes a plurality of memory cell arrays each made of word lines and column lines; normal column arrays and spare column arrays respectively formed in the memory cell array; data input/output line connected to a data bus line of the memory cell array and for inputting/outputting the normal/spare column data; a global normal column decoder for simultaneously selecting the normal column lines of each memory cell array; a data bus sense amplifier for amplifying data applied to the data input/output line of the memory cell array and then outputting them to an output port; and a spare column decoder for outputting the spare column line selecting signal for selecting the spare column lines of each spare column array.

In the semiconductor memory device of the invention, the spare column decoder for selecting spare column lines of the spare column arrays is in each spare column array individually.

Figure 5:
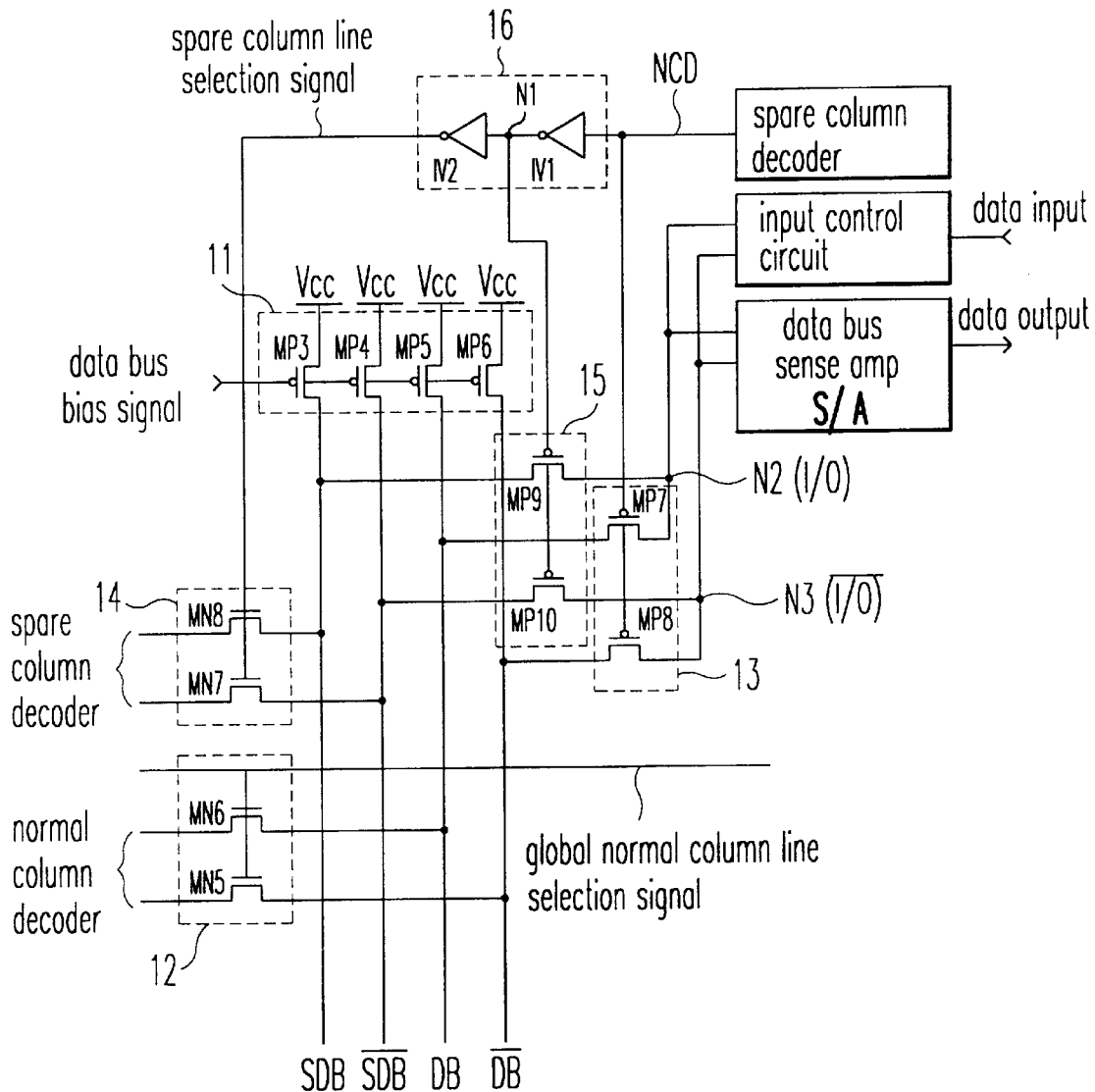
FIG. 5 is a controlling circuit diagram of a memory cell array of the semiconductor memory device of FIG. 4.

As illustrated in FIG. 5, the memory cell controlling circuit includes a data bus & spare data bus bias switching part 11 made of four transistors turned on by a data bus bias signal, and for precharging power voltage to the data bus line and the spare data bus line; a normal column switching part 12 made of two transistors turned on by the global normal column line selecting signal, and transferring the normal column data of the normal column line to the data bus line; a normal column data path switching part 13 made of two transistors for receiving the normal column enable signal through its gate, and transferring the normal column data loaded in the data bus line to the data bus input/output line; an inverter part 16 for receiving an output of the spare column decoder, outputting the spare column line selecting signal for turning on the transistor of the spare column switching part, and also generating an output signal for turning on the transistor of the spare column data path switching part; a spare column switching part 14 turned on by the output signal of the inverter part, and transferring the spare column data to the spare data bus line; a spare column data path switching part 15 made of two transistors turned on by the output signal of the first inverter, and transferring the spare column data output to the spare data bus line to the data input/output line; a data bus sense amplifier for amplifying the normal/spare column data output to the data input/output line, and outputting them to the output port; and an input controlling circuit for outputting the input data to the data input/output line.

The data bus & spare data bus bias switching part 11 include a third PMOS type transistor MP3 connected between the power voltage Vcc and the spare data bus line; a fourth PMOS type transistor MP4 connected between the power voltage Vcc and the inverted spare data bus line; a fifth PMOS type transistor MP5 connected between the power voltage and the data bus line; and a sixth PMOS type transistor MP6 connected between the power voltage and the inverted data bus line.

The normal column switching part 12 includes a sixth NMOS type transistor MN6 for receiving the global normal column line selecting signal through its gate, and transferring the normal column data to the data bus line; and a fifth NMOS type transistor MN5 for receiving the normal column line selecting signal through its gate, and transferring the normal column data to the inverted data bus line.

The normal column data path switching part 13 includes a seventh PMOS type transistor MP7 for receiving an output signal of the spare column decoder part through its gate, and transferring the normal column data applied to the data bus line to the data input/output line I/O; and an eighth PMOS type transistor MP8 for receiving an output signal of the spare column decoder through its gate, and transferring the normal column data applied to the inverted data bus line to the data input/output line I/O.

The inverter part 16 includes a first inverter IV1 for inverting the output signal of the spare column decoder part, and outputting it to the input ports of a second inverter IV2 and the spare column data path switching part 15; and the second inverter IV2 for receiving the output signal of the first inverter IV1, and outputting the inverted signal to the input port of the spare column switching part 14.

The spare column switching part 14 includes an eighth NMOS type transistor MN8 for receiving the output signal of the second inverter IV2 through its gate, and transferring the spare column data to the spare data bus line; and a seventh NMOS type transistor MN7 for receiving the output signal of the second inverter IV2 through its gate, and transferring the spare column data to the inverted spare data bus line.

The spare column data path switching part 15 includes a ninth PMOS type transistor MP9 for receiving the output signal of the first inverter IV1 through its gate, and transferring the spare column data applied to the spare data bus line to the data input/output line I/O; and a tenth PMOS type transistor MP10 for receiving the output signal of the first inverter IV1 through its gate, and transferring the spare column data applied to the inverted data bus line to the data input/output line I/O.

The operation of the invention is as follows.

If the global normal column line selecting signal output from the global normal column decoder is applied to the gates of the fifth and sixth NMOS type transistors MN5 and MN6 at the state where the data bus bias signal is precharged to be LOW and thus the data bus line and the spare data bus line are enabled, the normal column data are transferred to the data bus line and the inverted data bus line. The normal column data are transferred to the data input/output line I/O through the seventh and eighth PMOS type transistors MP7 and MP8 turned on by the normal column enable signal applied to their gates, amplified by the data bus sense amplifier and output to the output port. If a certain defect is generated in the normal column line, and the line should therefor be alternated with a spare column line, the spare column line selecting signal is output from the spare column decoder to thereby select the spare column line. Here, the seventh and eighth PMOS type transistors MP7 and MP8 of the normal column data path switching part 13 are turned off by the normal column disable signal to cut off to output the normal column data loaded in the data bus line to the output port through the data input/output line I/O. Thus, the global normal column data does not need to be disabled. Moreover, the output signal of the spare column decoder is applied to the gates of the seventh and eighth NMOS type transistor MN7 and MN8 of the spare column switching part 14, so that the spare column data are transferred to the spare data bus line and the inverted spare data bus line. The spare column data are applied to the data input/output line I/O through the ninth and tenth PMOS type transistors MP9 and MP10 of the spare column data path switching part 15 which is turned on by the output signal of the first inverter IV1, amplified by the data bus line sense amplifier and output to the output port.

Figure 6:
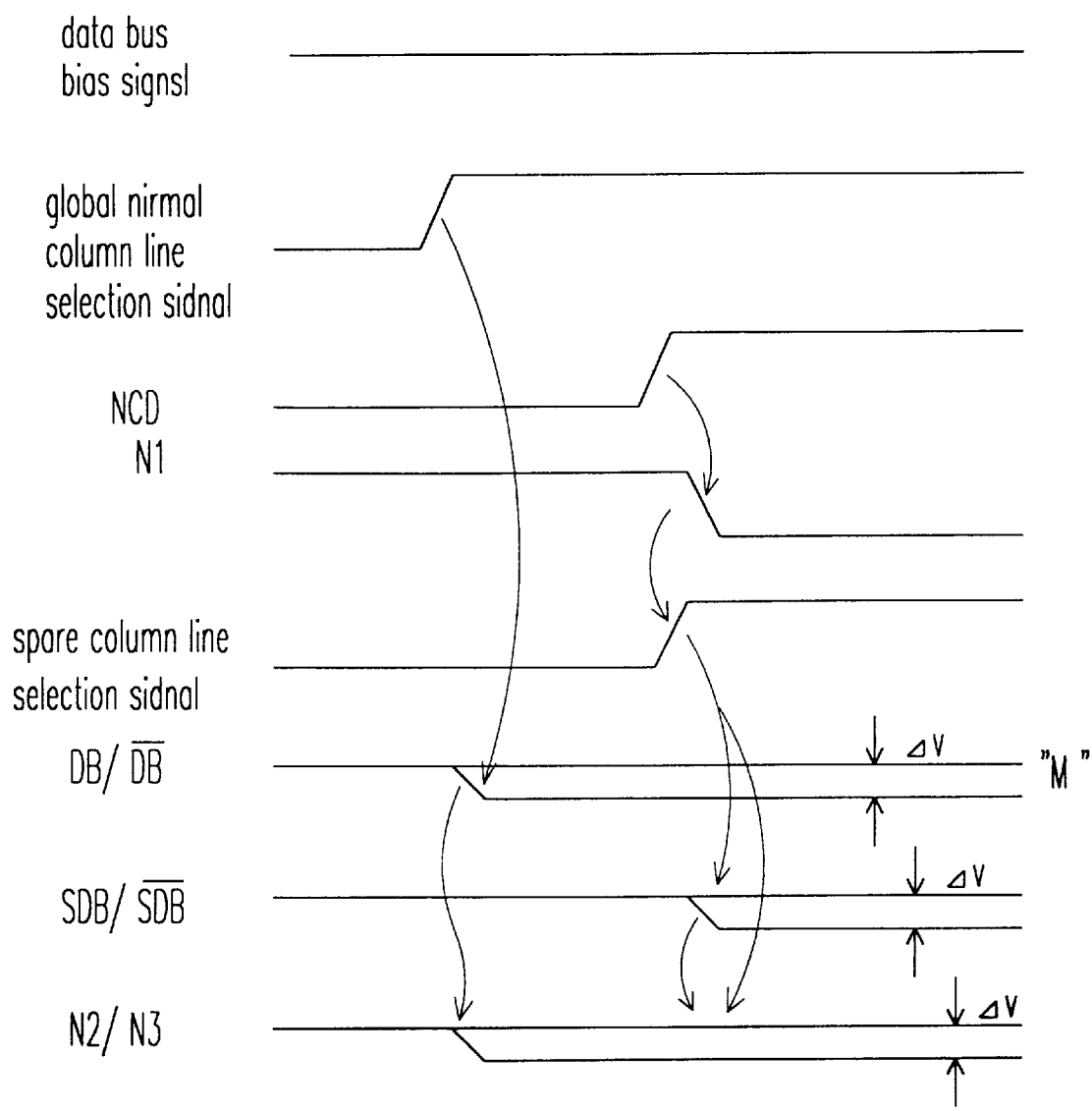
FIG. 6 is an operational timing diagram of the memory cell array controlling circuit of the semiconductor memory device of FIG. 5.

As illustrated in FIG. 6, if the global normal column line selecting signal is enabled, the normal column data are outputted to the data bus line and the inverted data bus line and output to the second and third nodes N2 and N3. If the normal column disable signal is applied, the signal level at the output port of the first inverter IV1, namely, the first node N1 gets down to LOW from HIGH, and the spare column line selecting signal is outputted in order to transfer the spare column data to the spare data bus line and the inverted spare data bus line. Instead of the normal column data, the spare column data are outputted to the second and third nodes N2 and N3.

As described above, the column redundancy circuit of the invention in the semiconductor memory device enhances the repairing efficiency and increases the yield of the device.

It will be apparent to those skilled in the art that various modifications and variations can be made in the semiconductor memory device with a spare column decoder of the present invention without departing from the spirit or scope of the invention. Thus, it is intended that the present invention cover the modifications and variations of this invention provided that they come within the scope of the appended claims and their equivalents.

What is claimed is:

1. A semiconductor memory device having plural memory cell arrays, the device comprising:
    a) normal column cell arrays including normal column lines;
    b) a global column decoder for simultaneously selecting the normal column lines of the normal column cell array;
    c) spare column cell arrays including spare column lines;
    d) spare column decoders, respectively and independently formed in the spare column cell arrays, for selecting the spare column lines of each spare column cell array;
    e) data bus and spare data bus bias switching means for applying a power voltage to a data bus line and a spare data bus line;
    f) normal column switching means, connected between normal column lines and turned on by a global normal column line selecting signal, for transferring normal column data to the data bus line;
    g) normal column data path switching means, turned on by a normal column enable signal, for transferring the normal column data that was transferred to the data bus line to a data input/output line;
    h) spare column data switching means, connected between spare column lines and turned on by a spare column line selecting signal, for transferring spare column data to the spare data bus line;
    i) spare column data path switching means, turned on by an output signal of a first inverter, for transferring the spare column data transferred to the spare data bus line to the data input/output line; and
    j) inverter means for receiving an output signal of the spare column decoder and for turning on transistors of the spare column data switching means, and for turning on path transistors of the spare column data path switching means, the spare column cell arrays being independently controlled;
    wherein:
        a) the data bus and spare data bus bias switching means includes:
            1) a gate for receiving a data bus bias signal, and
            2) PMOS transistors connected between the power voltage and each data bus line, and between the power voltage and the spare data bus line;
        b) the normal column switching means includes NMOS transistors; and
        c) the normal column data path switching means includes PMOS transistors having gates for receiving the output signal of the spare column decoder.

2. The device of claim 1, wherein the spare column data path switching means includes:
    PMOS transistors having gates for receiving an output signal of the first inverter.

3. The device of claim 2, wherein:
    if the global column decoder is enabled, the normal data bus line is selected; and
    if the spare column decoder is enabled while the global column decoder is enabled, the spare data bus line is selected, and simultaneously the spare data bus line is connected to the input/output line while the normal data bus line is cut off from the input/output line.

4. The device of claim 1, wherein:
    if the global column decoder is enabled, the normal data bus line is selected; and
    if the spare column decoder is enabled while the global column decoder is enabled, the spare data bus line is selected, and simultaneously the spare data bus line is connected to the input/output line while the normal data bus line is cut off from the input/output line.

* * * * *